United States Patent
Huang et al.

(10) Patent No.: US 10,811,564 B2
(45) Date of Patent: Oct. 20, 2020

(54) LIGHT-EMITTING DEVICE

(71) Applicant: EPISTAR CORPORATION, Hsinchu (TW)

(72) Inventors: Kuo-Feng Huang, Hsinchu (TW); Cheng-Hsing Chiang, Hsinchu (TW); Jih-Ming Tu, Hsinchu (TW)

(73) Assignee: EPISTAR CORPORATION, Hsinchu (TW)

( * ) Notice: Subject to any disclaimer, the term of this patent is extended or adjusted under 35 U.S.C. 154(b) by 0 days.

(21) Appl. No.: 16/247,191

(22) Filed: Jan. 14, 2019

(65) Prior Publication Data

US 2019/0148591 A1 May 16, 2019

Related U.S. Application Data

(63) Continuation of application No. 15/722,551, filed on Oct. 2, 2017, now Pat. No. 10,199,541, which is a continuation of application No. 14/873,547, filed on Oct. 2, 2015, now Pat. No. 9,847,454.

(51) Int. Cl.
*H01L 33/30* (2010.01)
*H01L 33/00* (2010.01)
*H01L 33/02* (2010.01)
*H01L 33/06* (2010.01)
*H01L 33/14* (2010.01)
(Continued)

(52) U.S. Cl.
CPC .......... *H01L 33/30* (2013.01); *H01L 33/0062* (2013.01); *H01L 33/0095* (2013.01); *H01L 33/025* (2013.01); *H01L 33/06* (2013.01); *H01L 33/14* (2013.01); *H01L 33/22* (2013.01); *H01L 33/38* (2013.01); *H01L 2933/0083* (2013.01); *H01L 2933/0091* (2013.01)

(58) Field of Classification Search
CPC ....... H01L 33/025; H01L 33/06; H01L 33/14; H01L 2933/0091; H01L 33/30; H01L 2933/0083; H01L 33/22; H01L 33/38
See application file for complete search history.

(56) References Cited

U.S. PATENT DOCUMENTS

| 7,037,738 | B2 * | 5/2006 | Sugiyama | ............... H01L 33/22 257/E33.074 |
| 7,906,795 | B2 | 3/2011 | Huang et al. | |

(Continued)

*Primary Examiner* — Bac H Au
(74) *Attorney, Agent, or Firm* — Ditthavong & Steiner P.C.

(57) ABSTRACT

A light-emitting device is provided. The light-emitting device comprises The light-emitting device comprises a light-emitting stack comprising a first semiconductor layer, a second semiconductor layer and an active layer between the first semiconductor layer and the second semiconductor layer; and a third semiconductor layer on the light-emitting stack and comprising a first sub-layer, a second sub-layer and a roughened surface, wherein the first sub-layer has the same composition as that of the second sub-layer, and the second sub-layer is farther from the light-emitting stack than the first sub-layer; wherein the first sub-layer and the second sub-layer each comprises a Group III element and a Group V element, and an atomic ratio of the Group III element to the Group V element of the first sub-layer is less than an atomic ratio of the Group III element to the Group V element of the second sub-layer.

20 Claims, 12 Drawing Sheets

(51) Int. Cl.
*H01L 33/22* (2010.01)
*H01L 33/38* (2010.01)

(56) References Cited

U.S. PATENT DOCUMENTS

| | | | | |
|---|---|---|---|---|
| 8,207,550 | B2* | 6/2012 | Chen | H01L 33/46 |
| | | | | 257/98 |
| 9,331,239 | B1* | 5/2016 | Lin | H01L 33/06 |
| 2003/0128729 | A1* | 7/2003 | Matsumura | H01S 5/22 |
| | | | | 372/46.01 |
| 2008/0283819 | A1 | 11/2008 | Konno | |
| 2011/0042646 | A1* | 2/2011 | Ohta | B82Y 20/00 |
| | | | | 257/14 |
| 2011/0286487 | A1* | 11/2011 | Sato | B82Y 20/00 |
| | | | | 372/45.011 |
| 2015/0063392 | A1* | 3/2015 | Takayama | H01S 5/2205 |
| | | | | 372/45.01 |
| 2015/0146756 | A1* | 5/2015 | Kawaguchi | H01L 33/04 |
| | | | | 372/45.012 |

* cited by examiner

LIGHT-EMITTING DEVICE

REFERENCE TO RELATED APPLICATION

This application a continuation of a U.S. patent application Ser. No. 15/722,551, filed Oct. 2, 2017, entitled "LIGHT-EMITTING DEVICE," which is a continuation of a U.S. patent application Ser. No. 14/873,547 (Now U.S. Pat. No. 9,847,454), filed Oct. 2, 2015, entitled "LIGHT-EMITTING DEVICE," the contents of which are hereby incorporated herein in their entirety by this reference.

TECHNICAL FIELD

The disclosure relates to a light-emitting device, and particularly to a light-emitting device comprising a semiconductor layer having a roughened surface and the manufacturing method thereof.

DESCRIPTION OF BACKGROUND ART

Light-emitting diodes (LEDs) are widely used as solid-state light sources. Compared to conventional incandescent light lamps or fluorescent light tubes, LEDs have advantages such as lower power consumption and longer lifetime, and therefore LEDs gradually replace the conventional light sources and are applied to various fields such as traffic lights, back light modules, street lighting, and biomedical device.

SUMMARY OF THE DISCLOSURE

The present disclosure provides a light-emitting device. The light-emitting device includes a light-emitting stack, an electrode on the light-emitting stack, and a semiconductor structure on the light-emitting stack. The semiconductor structure has a first portion with a roughed surface and a second portion with an unroughened surface. The first portion has a Group III element with a first atomic percentage decreasing along a direction from the electrode to the light-emitting stack.

The present disclosure provides another light-emitting device. The light-emitting device includes a light-emitting stack, an electrode on the light-emitting stack, and a semiconductor layer on the light-emitting stack. The semiconductor layer includes a roughened surface and an upper surface. The roughened surface is exposed from the electrode and the upper surface is covered by the electrode. The upper surface is farther from the light-emitting stack than the roughened surface.

The present disclosure provides another light-emitting device. The light-emitting device includes a light-emitting stack, an electrode and a contact layer. The electrode is on the light-emitting stack and includes a main part, multiple extensions extended from the main part. The contact layer is between the light-emitting stack and the multiple extensions, and is devoid of locating between the light-emitting stack and the main part of the electrode.

BRIEF DESCRIPTION OF THE DRAWINGS

The foregoing aspects and many of the attendant advantages of this disclosure will become more readily appreciated as the same becomes better understood by reference to the following detailed description, when taken in conjunction with the accompanying drawings, wherein.

DETAILED DESCRIPTION OF PREFERRED EMBODIMENTS

Figure 1:
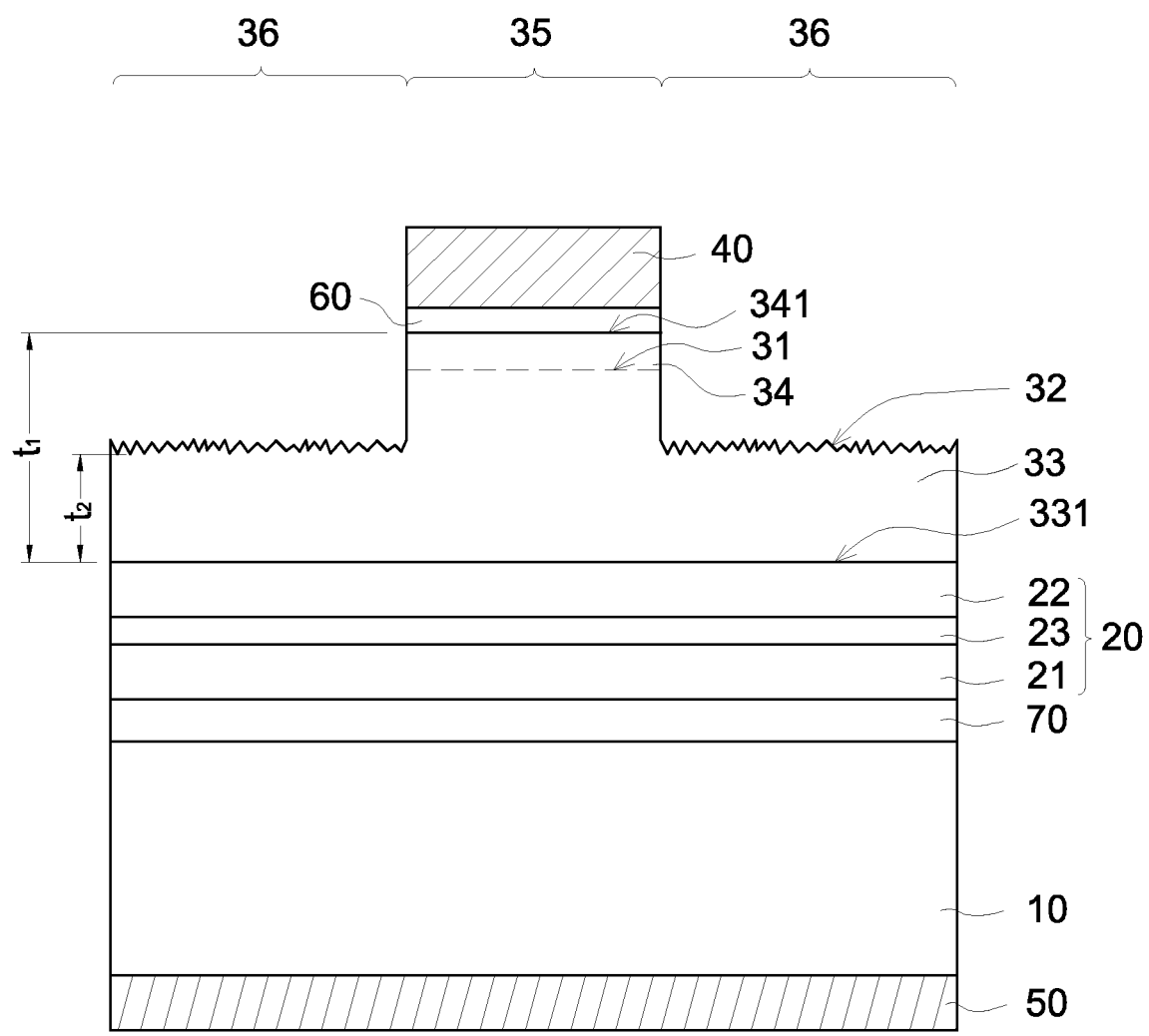
FIG. 1 shows a first embodiment of a light-emitting device in accordance with the present disclosure.

Exemplary embodiments of the present disclosure will be described in detail with reference to the accompanying drawings hereafter. The following embodiments are given by way of illustration to help those skilled in the art fully understand the spirit of the present disclosure. Hence, it should be noted that the present disclosure is not limited to the embodiments herein and can be realized by various forms. Further, the drawings are not precise scale and components may be exaggerated in view of width, height, length, etc. Herein, the similar or identical reference numerals will denote the similar or identical components throughout the drawings.

In the present disclosure, if not specifically mention, the general expression of AlGaAs means $Al_xGa_{(1-x)}As$, wherein $0 \le x \le 1$; the general expression of AlInP means $Al_xIn_{(1-x)}P$, wherein $0 \le x \le 1$; the general expression of AlGaInP means $(Al_yGa_{(1-y)})_{1-x}In_xP$, wherein $0 \le x \le 1$, $0 \le y \le 1$; the general expression of AlGaN means $Al_xGa_{(1-x)}N$, wherein $0 \le x \le 1$; the general expression of AlAsSb means $Al_xAs_{(1-x)}Sb$ wherein $0 \le x \le 1$ and the general expression of InGaP means $In_xGa_{1-x}P$, wherein $0 \le x \le 1$. The content of the element can be adjusted for different purposes, such as matching the lattice constant of the growth substrate or adjusting the dominant wavelength.

Figure 2:
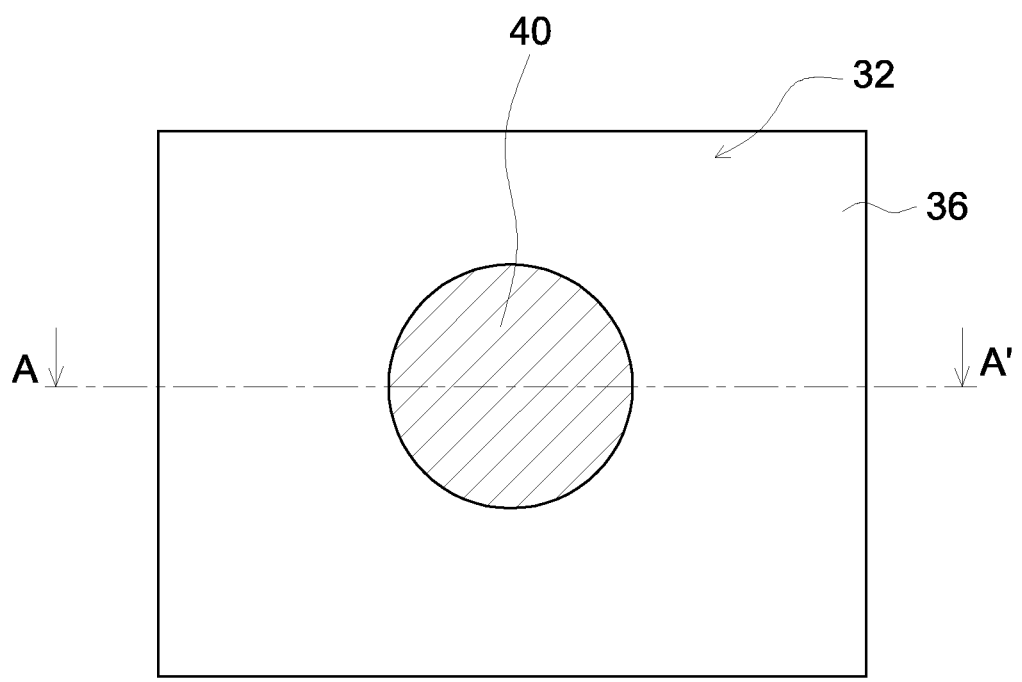
FIG. 2 is a top view of the light-emitting device shown in FIG. 1.
Figure 3:
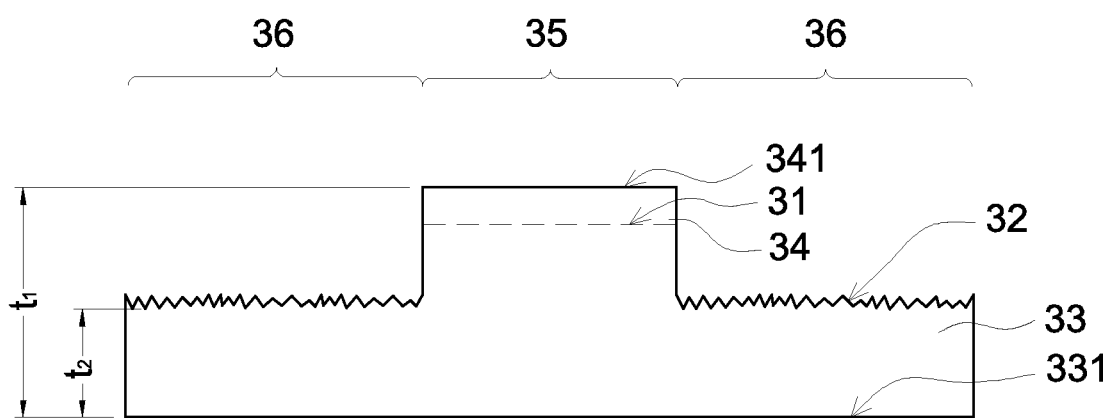
FIG. 3 is a cross-sectional diagram showing the third semiconductor layer of the embodiment in FIG. 1.

FIG. 1 shows a first embodiment of a light-emitting device in accordance with the present disclosure. FIG. 2 is a top view of the light-emitting device shown in FIG. 1. FIG. 3 is a cross-sectional diagram showing the third semiconductor layer of the embodiment in FIG. 1. The light-emitting device 1 comprises a substrate 10, a light-emitting stack 20 on the substrate 10, a third semiconductor layer 30 as shown in FIG. 3 on the light-emitting stack 20, a first electrode 40 on the third semiconductor layer 30, and a second electrode 50 on the other side of the substrate 10 opposite to the light-emitting stack 20. The light-emitting stack 20 further comprises a first semiconductor layer 21 on the substrate 10, a second semiconductor layer 22 on the first semiconductor layer 21, and an active layer 23 interposed between the first semiconductor layer 21 and the second semiconductor layer 22. In the present embodiment, the light-emitting stack 20 and the third semiconductor layer 30 are all lattice matched to the substrate 10. The third semiconductor layer 30 has a conductivity type the same as that of the second semiconductor layer 22, such as p-type in the present embodiment.

Referring to FIG. 1 and FIG. 3, the third semiconductor layer 30 comprises an interface 31 and a roughened surface 32. In the present embodiment, a level of the roughened surface 32 is between the light-emitting stack 20 and the interface 31. Specifically, a level of the roughened surface 32 is between a level of the light-emitting stack 20 and a level of the interface 31. The third semiconductor layer 30 comprises an element having different atomic percentages on the two sides of the interface 31. Specifically, the third semiconductor layer 30 comprises a first sub-layer 33 on the light-emitting stack 20, a second sub-layer 34 on the first sub-layer 33, and the interface 31 is between the first sub-layer 33 and the second sub-layer 34, wherein the first sub-layer 33 and the second sub-layer 34 have the same composition and with different atomic ratios. Specifically, because the first sub-layer 33 and the second sub-layer 34 have the same composition, the interface 31 may be hard to distinguishable in an SEM image. The interface 31 is distinguishable by an elemental analysis such as Energy dispersive spectroscopy (EDS) or Secondary Ion Mass Spectrometry (SIMS) by showing a transition of the elements across the interface 31. Specifically, the first sub-layer 33 and the second sub-layer 34 comprise the same Group III-V semiconductor composition comprising a Group III element and a Group V element, and an atomic ratio of the Group III element to the Group V element in the first sub-layer 33 is different from, and preferably, is less than that in the second sub-layer 34. Or, the first sub-layer 33 and the second sub-layer 34 comprise the same Group III-V semiconductor composition comprising two Group III elements, and an atomic ratio of one of the Group III element to the other Group III element in the first sub-layer 33 is different from, and preferably, is less than that in the second sub-layer 34. Specifically, the atomic percentage of the Group III element in the first sub-layer 33 is different from, and preferably, is less than that in the second sub-layer 34. In the present embodiment, one of the Group III elements is Al, the other Group III element is Ga, and the Group V element is P. In one embodiment, the semiconductor material of the first sub-layer 33 comprises $(Al_yGa_{(1-y)})_{1-x}In_xP$, and the semiconductor material of the second sub-layer 34 comprises $(Al_zGa_{(1-z)})_{1-x}In_xP$, wherein $0 \leq x < 1$, $z > y$, and $0 < (z-y) \leq 1$, and preferably, $0.1 \leq z-y \leq 0.5$, and more preferably, between $0.1 \leq z-y \leq 0.3$. In another embodiment, the semiconductor material of the first sub-layer 33 comprises $(Al_yGa_{(1-y)})_{1-x}In_xP$, wherein $0.4 \leq x \leq 0.6$, $0.3 \leq y \leq 0.5$, and the semiconductor material of the second sub-layer 34 comprises $(Al_zGa_{(1-z)})_{1-x}In_xP$, wherein $0.4 \leq x \leq 0.6$, $0.5 \leq z \leq 0.7$, and a difference between z and y is not less than 0.1. In one embodiment, the first sub-layer 33 comprises $Al_xGa_{(1-x)}As$, wherein $0.3 \leq x \leq 0.7$, and the second sub-layer 34 comprises $Al_yGa_{(1-y)}As$, wherein $0.4 \leq y \leq 0.8$, wherein a difference between x and y is not less than 0.1. Specifically, determined by an Energy dispersive spectroscopy (EDS) or a Secondary Ion Mass Spectrometry (SIMS), the atomic ratio of Al to Ga in the first sub-layer 33 is different from, and preferably, is less than that in the second sub-layer 34. Or, the atomic ratio of Al to P in the first sub-layer 33 is different from, and preferably, is less than that in the second sub-layer 34.

The second sub-layer 34 comprises an upper surface 341 farther from the light-emitting stack 20 than the roughened surface 32, wherein the upper surface 341 is an unroughened surface having a roughness smaller than that of the roughened surface 32. Preferably, the roughened surface 32 has an irregular or random surface texture. Referring to FIG. 1 through FIG. 3, the third semiconductor layer 30 comprises a first portion 35 and a second portion 36, wherein the first portion 35 is directly under the first electrode 40 and comprises the upper surface 341, and the second portion 36 substantially surrounds the first portion 35 and comprises the roughened surface 32. The upper surface 341 is substantially above the roughened surface 32. Specifically, the light emitted from the active layer 23 is substantially scattered by the roughened surface 32 and escapes from the second portion 36. In the present embodiment, the second sub-layer 34 is only located at the first portion 35 right under the first electrode 40, and the first sub-layer 33 is located at both the first region 35 and the second portion 36. As a result, the interface 31 is only in the first portion 35. The first portion 35 has a first thickness $t_1$ greater than a second thickness $t_2$ of the second portion 36. Preferably, the second thickness $t_2$ is between $0.3*t_1$ and $0.85*t_1$, and more preferably between $0.3*t_1$ and $0.7*t_1$, to gain enough process window during roughing and therefore, to ensure a good reliability of the light-emitting device. Specifically, the first thickness $t_1$ is determined as the distance between the upper face 341 and the bottom surface 331 of the third semiconductor layer 30. The second thickness $t_2$ is determined as the minimum distance between the roughened surface 32 and the bottom surface 331 of the third semiconductor layer 30. In one embodiment, the first thickness $t_1$ is not less than 1 m, and preferably, is not more than 4 μm, and more preferably, is between 2 μm and 3.5 μm both inclusive.

Figure 4:
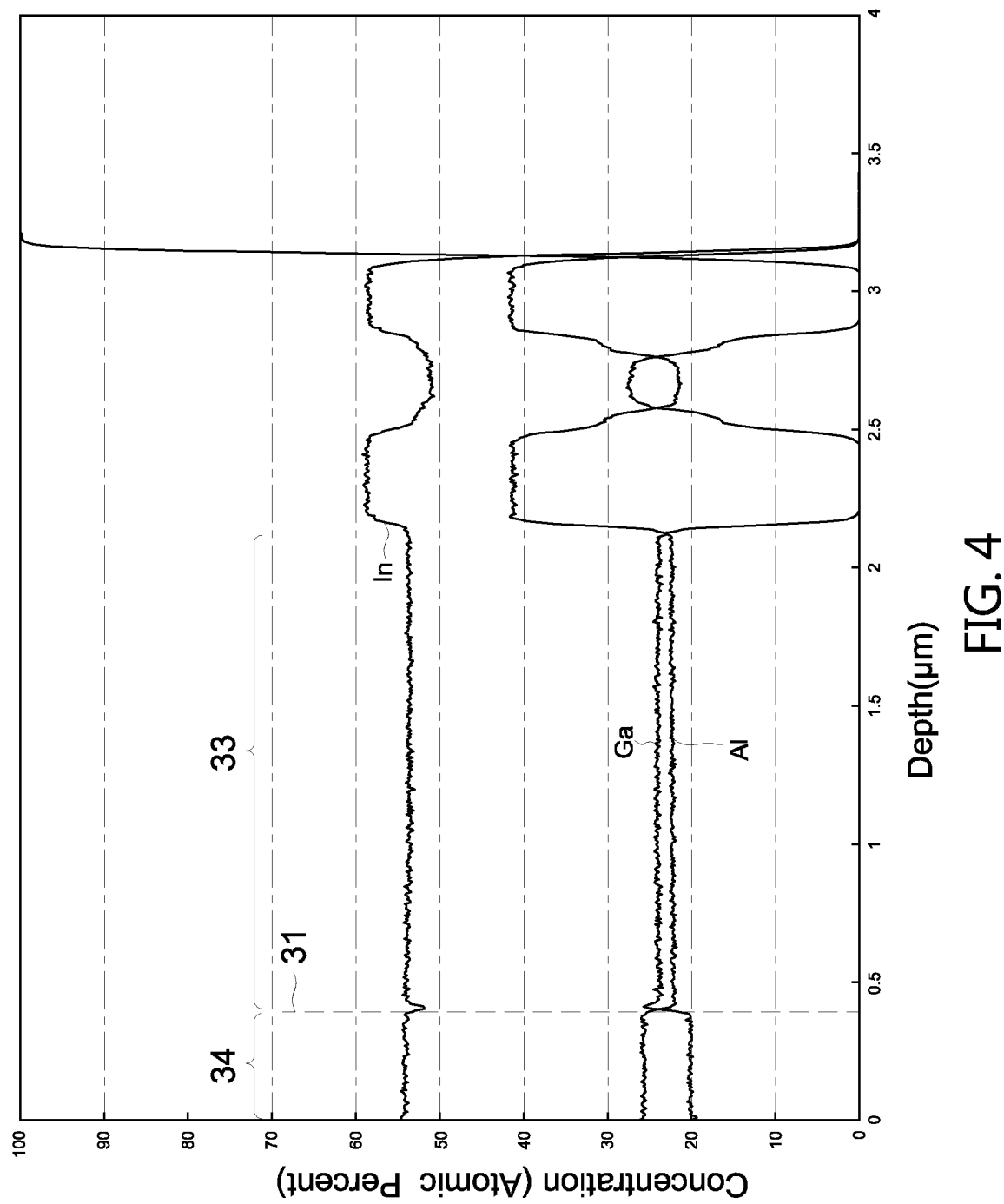
FIG. 4 is a SIMS (Secondary Ion Mass Spectrometry) analysis showing the atomic percentage of the elements across the interface between the second sub-layer and the first sub-layer of the first portion.

FIG. 4 is a SIMS (Secondary Ion Mass Spectrometry) analysis showing the atomic percentages of the elements across the interface 31 between the second sub-layer 34 and the first sub-layer 33 of the first portion 35. As shown in FIG. 4, the first sub-layer 33 and the second sub-layer 34 have the same composition and with different atomic ratios. Specifically, the first sub-layer 33 and the second sub-layer 34 both comprise a first group III element Al, a second group III element Ga, and a third group III element In. The atomic ratio of the first group III element to the second group III element is about 1.3:1 in the second sub-layer 34, and the atomic ratio of the first group III element to the second group III element is about 1.1:1.2 in the first sub-layer 33 while the atomic percentage of a third group III element In is substantially unchanged from the first sub-layer 33 to the second sub-layer 34. The atomic percentage of the first group III element Al is greater than that of the second group III element Ga in the second sub-layer 34, and the atomic percentage of the first group III element Al is less than that of the second group III element Ga in the first sub-layer 33. Furthermore, the third semiconductor layer 30 comprises different atomic percentages of the first group III element Al on the two sides of the interface 31, and preferably, an atomic percentage of the first group III element Al in the first sub-layer 33 is less than an atomic percentage of the first group III element Al in the second sub-layer 34.

Specifically, the first group III element Al in the first sub-layer 33 side of the interface 31 is about 22%, and the first group III element Al in the second sub-layer 34 side of the interface 31 is about 26%. In one embodiment, as shown in FIG. 1, the light-emitting device further comprises a first contact layer 60 between the first electrode 40 and the second sub-layer 34 of the third semiconductor layer 30 such that the first electrode 50 forms an ohmic contact with the third semiconductor layer 30 through the first contact layer 60. The conductivity type of the first contact layer 60 is the same as that of the third semiconductor layer 30. In one embodiment, the first contact layer is p-type and has a high p-type impurity concentration, such as greater than $10^{18}$/cm$^3$, and preferably, between $5*10^{18}$/cm$^3$ and $5*10^{19}$/cm$^3$ both inclusive. The material of the first contact layer 60 comprises a Group III-V semiconductor material, such as GaAs, AlGaAs, InGaP, GaP or AlGaInP.

In one embodiment, the light-emitting device further comprises a reflector 70 between the substrate 10 and the first semiconductor layer 21 for reflecting the light emitted from the active layer toward the front side of the light-emitting device, wherein the front side of the light-emitting device is the side where the first electrode 40 is situated and is opposite to the rear side where the second electrode 50 is situated. Preferably, the reflector 70 is a Distributed Bragg reflector comprising alternate first layers and second layers, wherein the refractive index of the first layers is different from the refractive index of the second layers. Each thickness of the first layers is larger than each thickness of the second layers. The number of the first layers and the number of the layers are, but not limited to 20, respectively. Preferably, the number of the first layers and the number of the second layers are, not more than 80, respectively. The material of the first layers and the second layers comprises semiconductor material comprising AGaAs, AlGaInP, AlAsSb or AlGaN, or dielectric oxide comprising TiO$_x$, SiO$_x$, or AlO$_x$.

In the present embodiment, the substrate 10 provides a top surface for epitaxially growing the reflector 70, the light-emitting stack 20, the third semiconductor layer 30, and the first contact layer 60. The substrate 10 has a thickness thick enough for supporting the layers or the structures grown thereon. Preferably, the substrate 10 has a thickness not less than 100 μm, and preferably, not greater than 250 μm. The substrate 10 is single crystal and comprises a semiconductor material, for example, a Group III-V semiconductor material or a Group IV semiconductor material. In one embodiment, the substrate 10 comprises a Group III-V semiconductor material of a conductivity type. In the present embodiment, the Group III-V semiconductor material comprises GaAs of n-type conductivity. The n-type dopant comprises Si.

The first electrode 40 and the second electrode 50 are for conducting a current therebetween. The material of the first electrode 40 and the second electrode 50 comprise transparent conductive material or metal material, wherein the transparent conductive material comprises transparent conductive oxide, and wherein the metal material comprises Au, Pt, GeAuNi, Ti, BeAu, GeAu, Al, or ZnAu.

The first semiconductor layer 21 and the second semiconductor layer 22 are of different conductivity types. In the present embodiment, the first semiconductor layer 21 is of n type for providing electrons, the second semiconductor layer 22 is of p type for providing holes. The band gap of the first semiconductor layer 21 and the band gap of the second semiconductor layer 22 are both higher than the band gap of the active layer 23. The active layer 23 emits light having a dominant wavelength. Preferably, the light is a visible light having a dominant wavelength between 550 nm and 680 nm or an infrared light having a dominant wavelength greater than 680 nm.

Figure 5A:
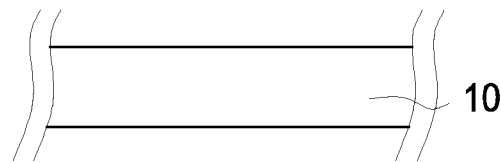
FIGS. 5a through 5d demonstrate the method for manufacturing the light-emitting device shown in FIG. 1.
Figure 5B:
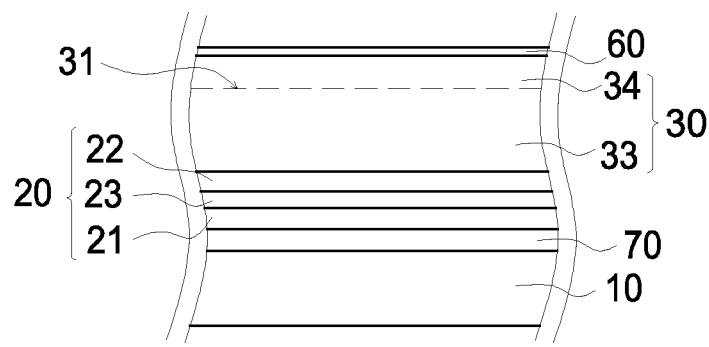
Figure 5C:
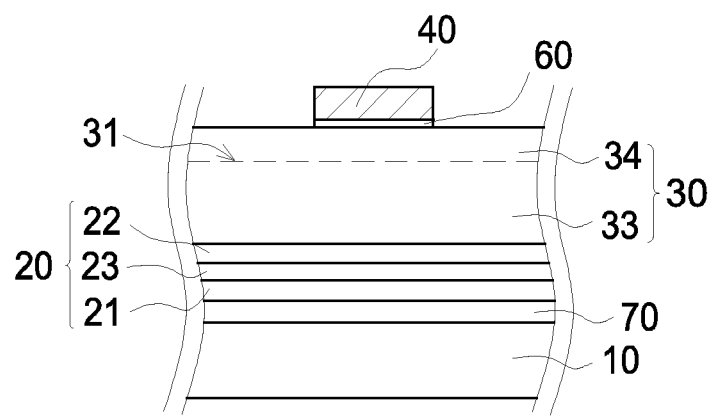
Figure 5D:
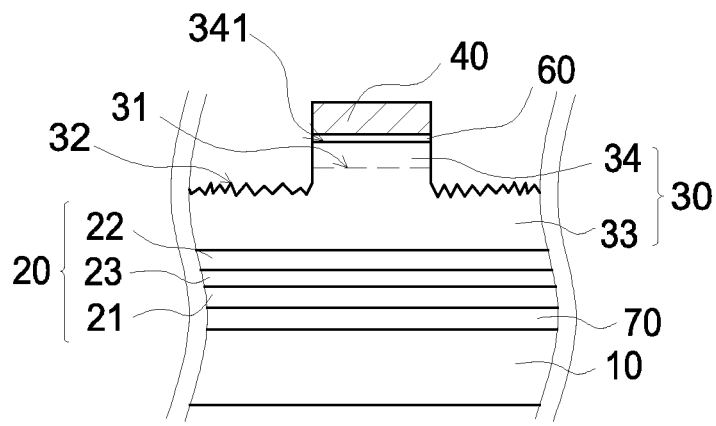

FIGS. 5a through 5d demonstrate the method for manufacturing the light-emitting device shown in FIG. 1. Referring to FIG. 5a, the method comprises the steps of providing a substrate 10; sequentially forming a reflector 70, a light-emitting stack 20, a third semiconductor layer 30 comprising a first sub-layer 33 on the light-emitting stack 20 and comprising a second sub-layer 34 on the first sub-layer 33, and a first contact layer 60 by epitaxial growth. The first sub-layer 33 has the same composition as that of the second sub-layer 34, but the composition of the first sub-layer 33 is with a different atomic ratio from that of the second sub-layer 34. Preferably, the second sub-layer 34 has a thickness smaller than a thickness of the first sub-layer 33. In one embodiment, the first sub-layer 33 has a thickness not less than 300 nm, and preferably, not more than 3500 nm. The second sub-layer 34 has a thickness not less than 300 nm, and preferably, not more than 2000 nm. Referring to FIG. 5c, the method further comprises forming a first electrode 40 on the first contact layer 60, patterning the first electrode 40 and the first contact layer 60 to expose a part of the second sub-layer 34 such that the third semiconductor layer 30 comprises a first portion 35 covered by the first electrode 40 as shown in FIG. 3 and an exposed portion not covered by the first electrode 40. Referring to FIG. 5d, the method further comprises the steps of roughing the exposed second sub-layer 34 by a chemical solution to form a second portion 36 comprising a roughened surface 32 as shown in FIG. 3, forming a second electrode 50 on the other side of the substrate 10 opposite to the light-emitting stack 20, and dicing the structure shown in FIG. 5d so as to obtain multiple finished light-emitting devices as shown in FIG. 1. The second portion 36 has a second thickness less than a first thickness of the first portion 35. An etching rate of the first sub-layer 33 is slower than an etching rate of the second sub-layer 34 to the chemical solution, In the present embodiment, the chemical solution comprises an acid solution comprising HCl, citric acid, or HF. Specifically, after the roughing step, since the upper surface 341 of the second sub-layer 34 in the first portion 35 is protected by the first electrode 40, the upper surface 341 is unroughened and the roughness of an upper surface 341 of the second sub-layer 34 of the first portion 35 remains substantially unaffected. Therefore, the roughness of an upper surface 341 of the second sub-layer 34 is smaller than that of the roughened surface 32 of the second portion 36. In the present embodiment, after the roughing step, the second sub-layer 34 in the second portion 36 is completely removed and thus an upper part of the first sub-layer 33 is roughened to form the roughened surface 32.

Figure 6:
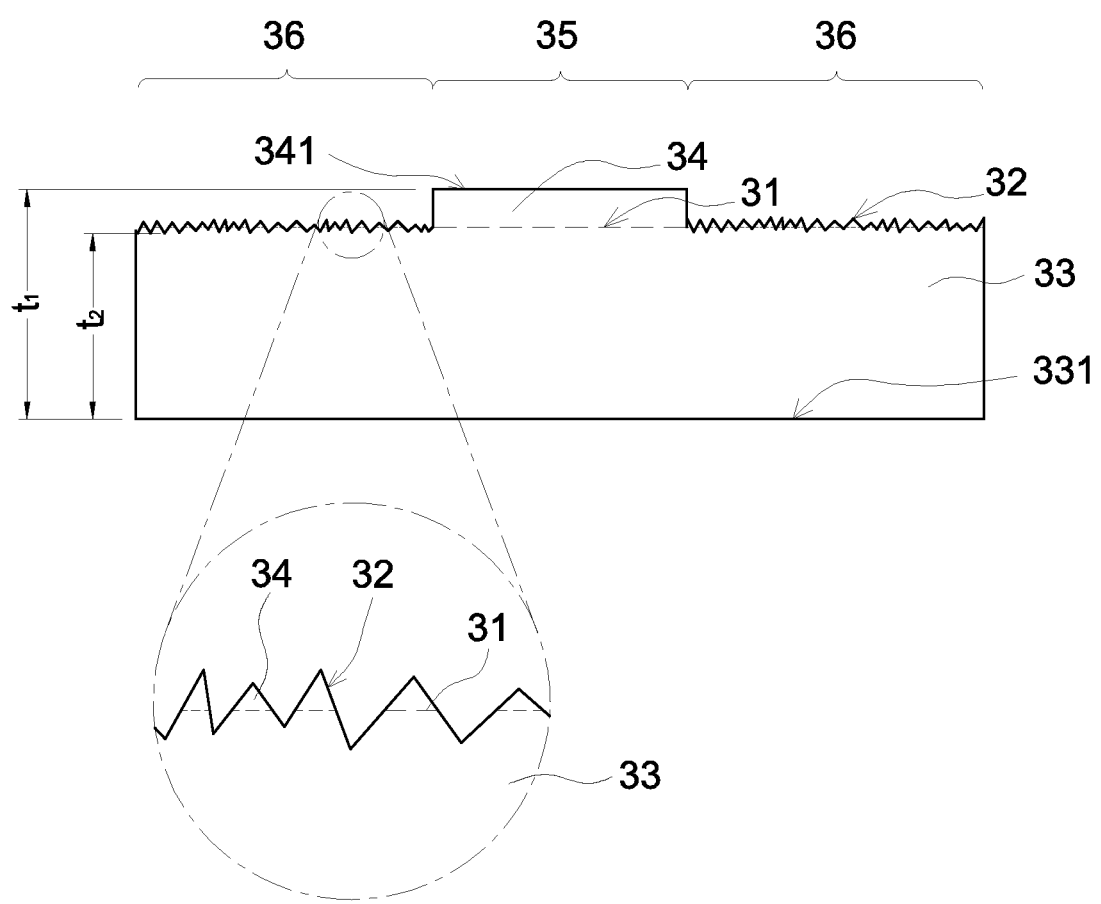
FIG. 6 is a cross-sectional diagram of the third semiconductor layer of a light-emitting device in accordance with the present disclosure.

FIG. 6 is a cross-sectional diagram of the third semiconductor layer of another embodiment in accordance with the present application. The second sub-layer 34 in the second portion 36 may not be completely removed. Therefore, the interface 31 may be in the first portion and the second portion 36. In one embodiment, the roughing surface 32 may be entirely above the interface 31.

The method of performing epitaxial growth comprises, but is not limited to metal-organic chemical vapor deposition (MOCVD), hydride vapor phase epitaxy (HVPE), molecular beam epitaxy (MBE), or liquid-phase epitaxy (LPE).

In the present disclosure, because the third semiconductor layer 30 comprises a first sub-layer 33 and a second sub-layer 34 having the same composition and with different atomic ratios, and the etching rate of the first sub-layer 33 is slower than the etching rate of the second sub-layer 34 to the chemical solution, after the roughing step, a desirable second thickness of the first sub-layer 33 is remained in the second portion 36 to gain enough process window during roughing and therefore, to ensure the light-emitting stack 20 against damage from the roughing step. As a result, the stability and reproducibility of the roughing step in the method is improved and the reliability of the light-emitting devices made by the method of the present disclosure is improved accordingly. The electrical performance of the light-emitting device of the present disclosure is also improved.

In another embodiment, the atomic percentage of the Group III element of the second sub-layer 34 is gradually changed toward the light-emitting stack 20 and the atomic percentage of the Group III element of the first sub-layer 33 is substantially constant. Specifically, the semiconductor material of the first sub-layer 33 comprises $(Al_yGa_{(1-y)})_{1-x}In_xP$, $0 \leq x < 1$, $0.3 \leq y \leq 0.5$, the semiconductor material of the second sub-layer 34 comprises $(Al_zGa_{(1-z)})_{1-x}In_xP$, $0 \leq x < 1$, $0.4 \leq z \leq 0.7$, and a difference between a maximum value of z in the second sub-layer 34 and x is not less than 0.1. In the present embodiment, z is gradually decreased from 0.55 to 0.45 in a direction toward the light-emitting stack 20. In the present embodiment, the third semiconductor layer 30 comprises an atomic percentage of Al in the first sub-layer 33 less than a maximum atomic percentage of Al in the second sub-layer 34. The atomic percentage of Al on the first sub-layer 33 side of the interface 31 is less than the maximum atomic percentage of Al on the second sub-layer 34 side of the interface 31.

In one embodiment, the third semiconductor layer 30 is not limited to comprise two sub-layers. The third semiconductor layer 30 may comprise more than two sub-layers. For example, the third semiconductor layer 30 comprises the first sub-layer 33, the second sub-layer 34 and a third sub-layer (not shown) between the light-emitting stack 20 and the first sub-layer 33. The third sub-layer, the first sub-layer 33, and the second sub-layer 34 have the same composition and with different atomic composition ratios. The atomic percentage of the Group III element of the third sub-layer is less than the atomic percentage of the Group III element of the first sub-layer. In the present embodiment, the third semiconductor layer 30 comprises two interfaces, one of which is between the third sub-layer and the first sub-layer 33, and the other one is between the first sub-layer 33 and the second sub-layer 34 the same as the embodiments mentioned above. Specifically, an atomic percentage of Al on the third sub-layer side of the one interface is less than an atomic percentage of Al on the first sub-layer side of the interface.

Figure 7:
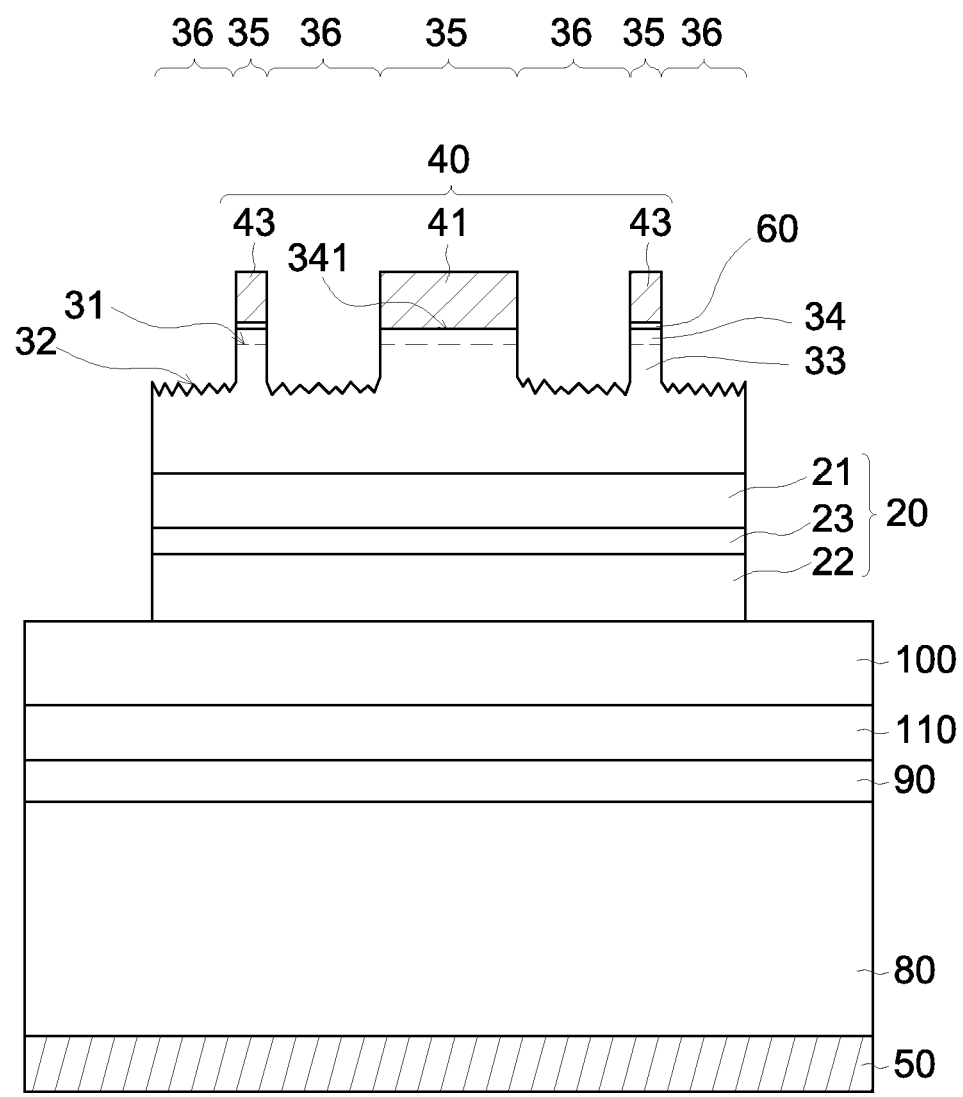
FIG. 7 is a second embodiment of a light-emitting device in accordance with the present disclosure.
Figure 8:
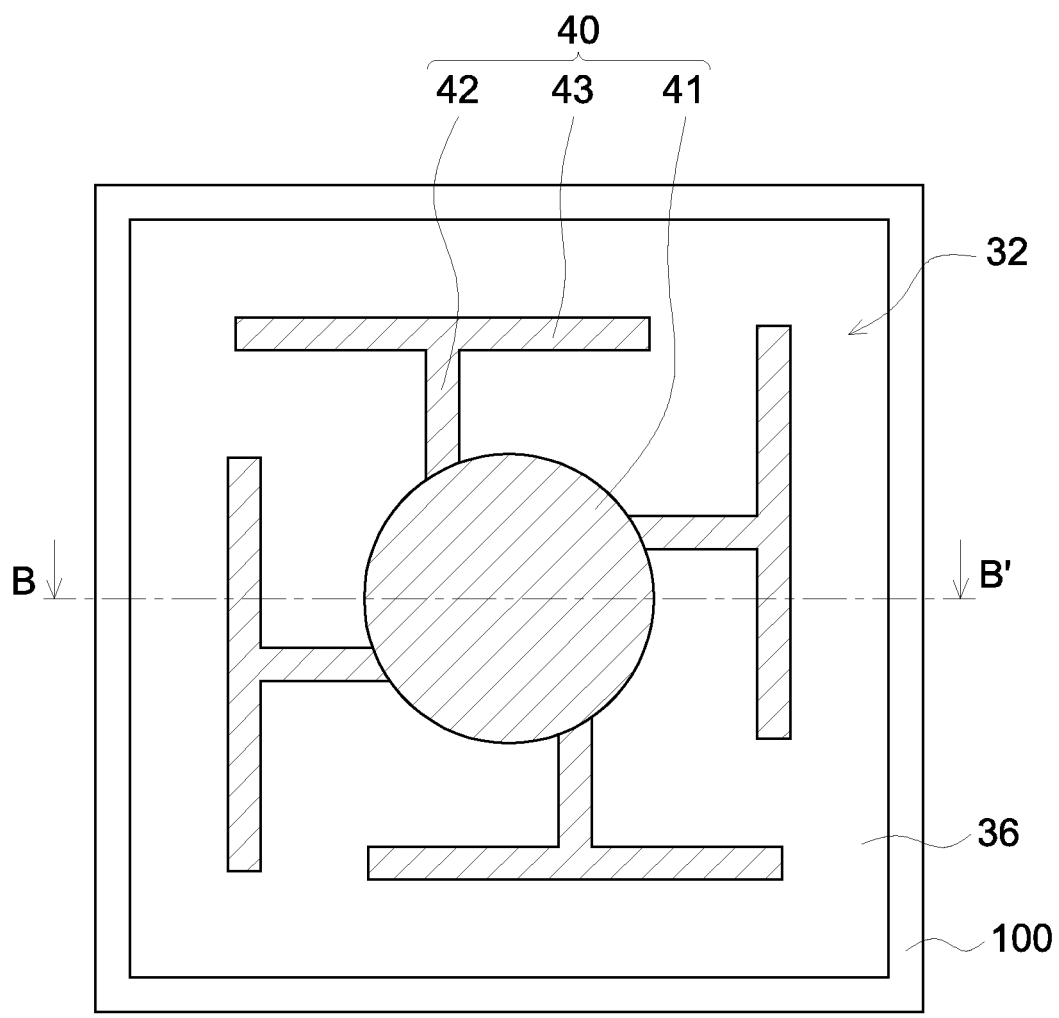
FIG. 8 is a top view of the light-emitting device shown in FIG. 7.

FIG. 7 is a second embodiment of a light-emitting device in accordance with the present disclosure. FIG. 8 is a top view of the light-emitting device shown in FIG. 7. The same reference number given or appeared in different paragraphs or figures along the specification should has the same or equivalent structure, material, material composition, the manufacturing process thereof while it is once defined anywhere of the disclosure. The difference between the third semiconductor layer 30 of the present embodiment and the third semiconductor layer 30 of the embodiments mentioned previously is that the third semiconductor layer 30 and the first semiconductor layer 21 are of n type. In the present embodiment, the light-emitting device comprises a permanent substrate 80 and a bonding layer 90 between the permanent substrate 80 and the light-emitting stack 20 for mechanically bonding the permanent substrate 80 to the light-emitting stack 20. Referring to FIG. 7, the first electrode 40 comprises a main part 41, multiple first extensions 42 and multiple second extensions 43. The main part 41 serves as a bonding pad for bonding to an external device through a metal wire or a metal bump. The first extensions 42 radially extend from the main part 41 toward borders of the light-emitting device respectively. The second extensions 43 are substantially perpendicular to the first extensions 42 and parallel to the borders respectively. The first extensions 42 and the second extensions 43 uniformly distribute current throughout the third semiconductor layer 30 when the light-emitting device is driven. The first contact layer 60 is patterned to have the same top-view pattern as the first electrode 40 except the area directly under the main part 41. That is to say, the first contact layer 60 is only between the first extension 42 and the third semiconductor layer 30 and is only between the second extension 43 and the third semiconductor layer 30. The light-emitting device further comprises a first current spreading layer 100 between the bonding layer 90 and the light-emitting stack 20 for improving current spreading through the light-emitting stack 20. The thickness of the first current spreading layer 100 is not less than 100 nm, and preferably, not greater than 5000 nm. The first current spreading layer 100 comprises a Group III-V semiconductor material, such as AlGaAs or AlGaInP, or transparent conductive oxide. The light-emitting device further comprises a second contact layer 110 between the bonding layer 90 and the first current spreading layer 100 such that the second electrode 50 is electrically connected to the light-emitting stack 20 through the second contact layer 110 for forming an ohmic contact between with the second electrode 50 and the light-emitting stack 20.

Figure 9A:
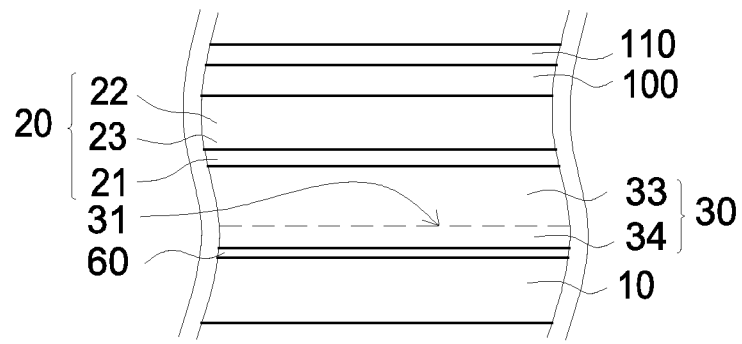
FIGS. 9a through 9f demonstrate the method for manufacturing the light-emitting device shown in FIG. 7.
Figure 9B:
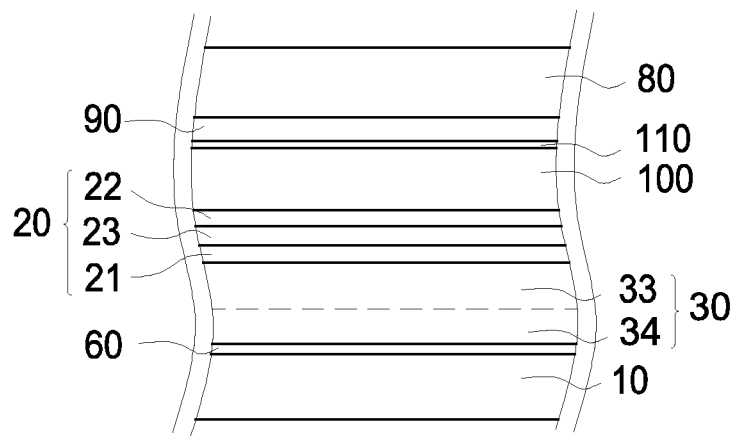
Figure 9C:
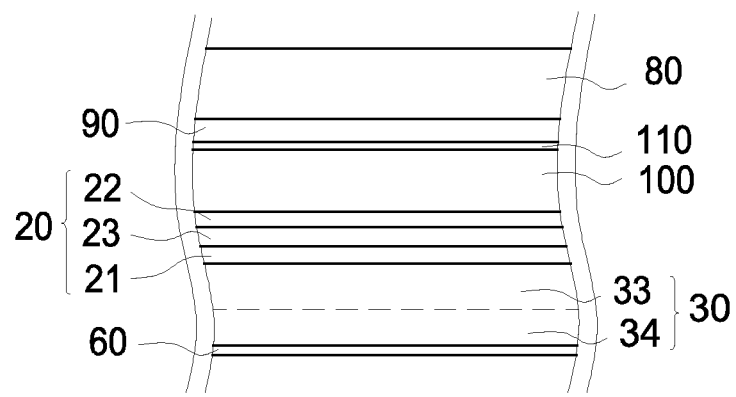
Figure 9D:
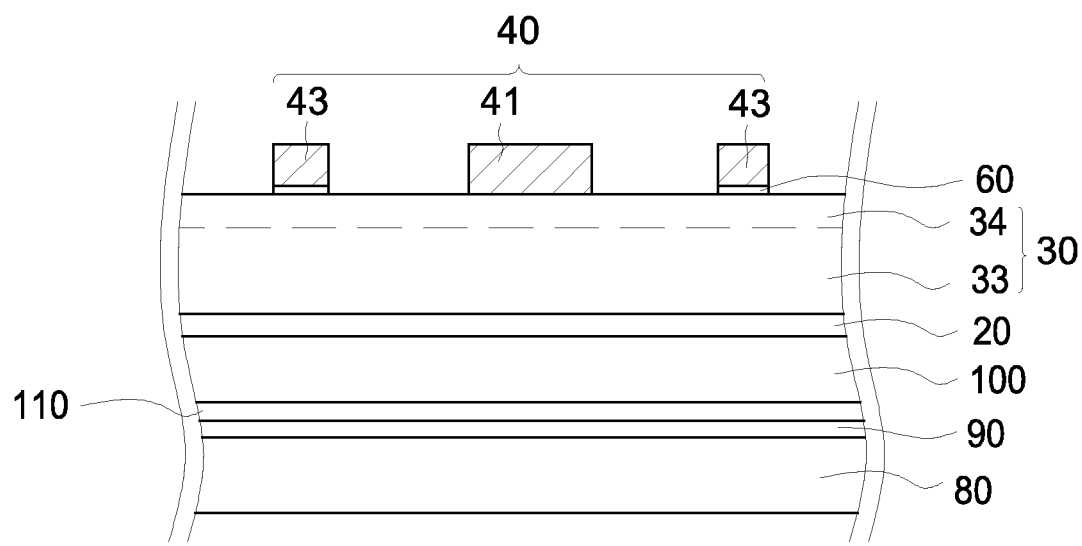
Figure 9E:
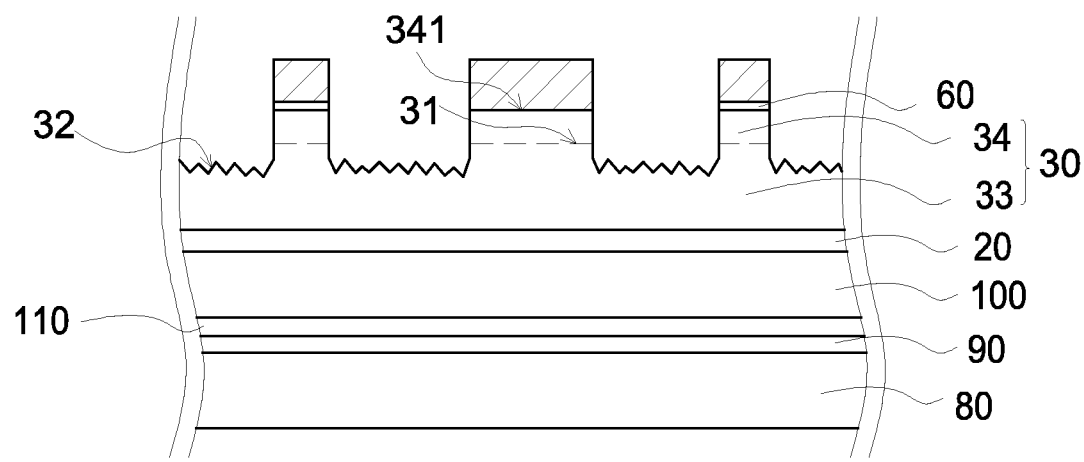
Figure 9F:
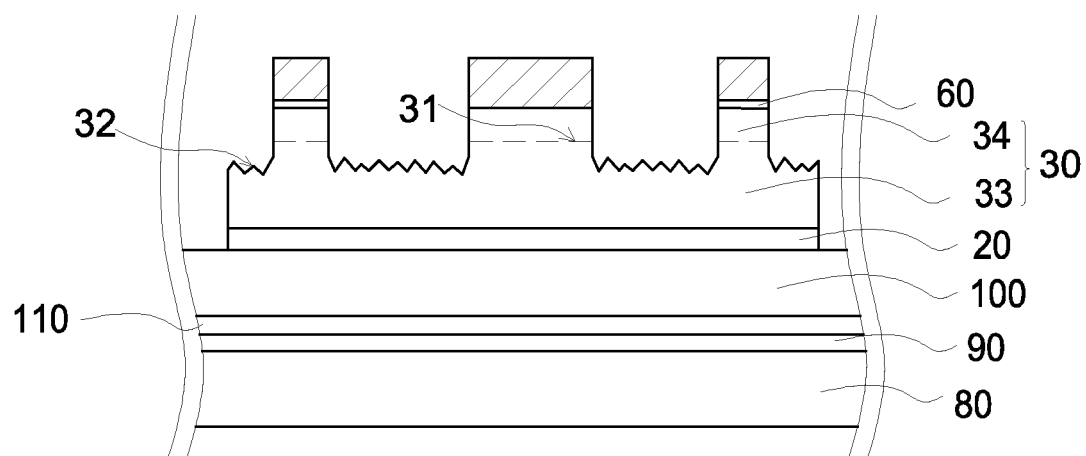
Figure 10:
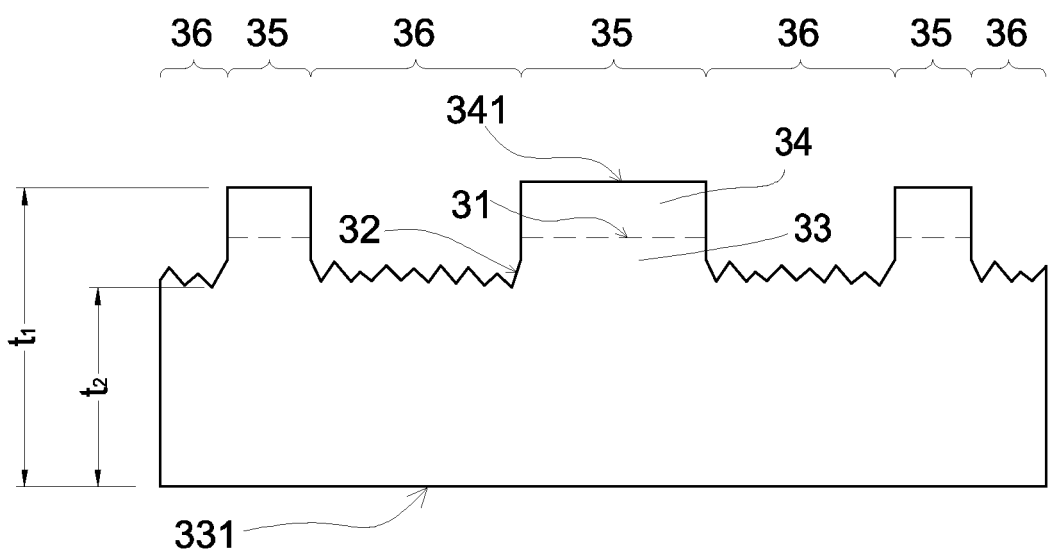
FIG. 10 is a cross-sectional diagram showing the third semiconductor layer of the embodiment in FIG. 7.

FIGS. 9a through 9f demonstrate the method for manufacturing the light-emitting device shown in FIG. 7. FIG. 10 is a cross-sectional diagram showing the third semiconductor layer of the embodiment in FIG. 7. Referring to FIG. 9a, the method comprises the steps of providing a substrate 10; sequentially forming a first contact layer 60, a third semiconductor layer 30 comprising a second sub-layer 34 on the first contact layer 60 and comprising a first sub-layer 33 on the second sub-layer 34, a light-emitting stack 20, a first current spreading layer 100 and a second contact layer 110 by epitaxial growth. The first sub-layer 33 has the same composition as that of the second sub-layer 34, but the composition of the first sub-layer 33 is with a different atomic ratio from that of the second sub-layer 34. Referring to FIG. 9b, the method further comprises the steps of bonding the structure as shown in FIG. 9a to a permanent substrate 80 by a bonding layer 90, removing the substrate to expose the first contact layer 60 as shown in FIG. 9c. The method further comprises the steps of patterning the first contact layer 60 to expose a part of the second sub-layer 34, and forming a first electrode 40 on the patterned first contact layer 60 and on a part of the exposed second sub-layer 34 such that the third semiconductor layer 30 comprises a first portion 35 covered by the first electrode 40 and an exposed portion not covered by the first electrode 40 as shown in FIG. 9d and FIG. 10. Referring to FIG. 9e and FIG. 10, the method further comprises the steps of roughing the exposed second sub-layer 34 by a chemical solution to form a second portion 36 comprising a roughened surface 32, forming a second electrode 50 on the other side of the permanent substrate 80 opposite to the light-emitting stack 20, and dicing the structure shown in FIG. 9f to obtain multiple finished light-emitting devices as shown in FIG. 7. The second portion 36 has a second thickness less than the first thickness of the first portion 35. An etching rate of the first sub-layer 33 is slower than an etching rate of the second sub-layer 34 to the chemical solution. The third semiconductor layer 30 after the roughing step is shown in FIG. 10. In one embodiment, referring to FIG. 9f, the method further comprises a step of removing a periphery part of the third semiconductor layer 30 and a periphery part of the light-emitting stack 20 to expose a part of the upper surface of the first current spreading layer 100 before the dicing step.

The permanent substrate 80 is electrically conductive for conducting a current flowing between the first electrode 40 and the second electrode 50. The permanent substrate 80 has a thickness thick enough for supporting the layers or structures thereon, for example, greater than 100 μm. The substrate comprises a conductive material comprising Si, Ge, Cu, Mo, MoW, AlN, ZnO or Al$_2$O$_3$. Preferably, the permanent substrate 80 comprises Si.

The bonding layer 90 comprises transparent conducive oxide, metal material, insulating oxide, or polymer. The transparent conducive oxide comprises indium tin oxide (ITO), indium oxide (InO), tin oxide (SnO), cadmium tin oxide (CTO), antimony tin oxide (ATO), aluminium zinc oxide (AZO), zinc tin oxide (ZTO), gallium doped zinc oxide (GZO), tungsten doped indium oxide (IWO), zinc oxide (ZnO), or indium zinc oxide (IZO). The metal material comprises In, Sn, Au, Ti, Ni, Pt, W or the alloys thereof. The insulating oxide comprises aluminum oxide (AlO$_x$), silicon oxide (SiO$_x$), or silicon oxynitride (SiO$_x$N$_y$). The polymer comprises epoxy, polyimide, perfluorocyclobutane, benzocyclobutene (BCB) or silicone. The bonding layer 90 has a thickness between 400 nm and 5000 nm.

Figure 11:
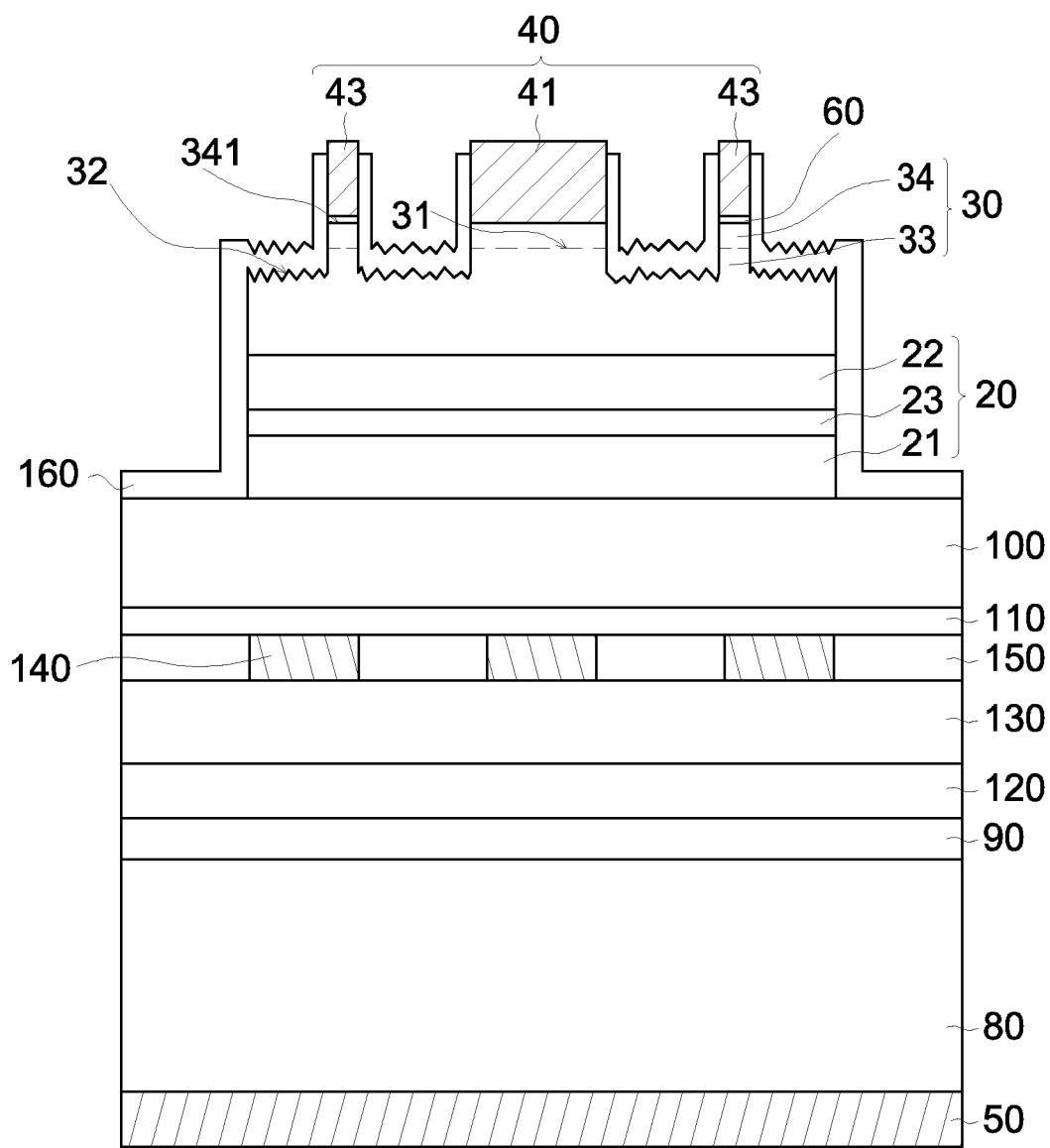
FIG. 11 is a cross-sectional diagram along a B-B' line of the light-emitting device of another embodiment in accordance in FIG. 8.

FIG. 11 is a cross-sectional diagram along a B-B' line of the light-emitting device of another embodiment in accordance in FIG. 8. The light-emitting device further comprises a reflecting system 200 between the bonding layer 90 and the light-emitting stack 20 for reflecting the light emitted from the active layer 23 toward the front side of the light-emitting device, wherein the front side of the light-emitting device is the side where the first electrode 40 is situated and is opposite to the rear side where the second electrode 50 is situated. The reflecting system 200 comprises a conductive reflector 120 comprising a material with a reflectivity greater than 90% for the light emitted from the active layer 23. Preferably, the conductive reflector 120 comprises metal, such as Au, Ag, Al or the combinations thereof. The conductive reflector 120 has a thickness of between about 2500 Å and 7500 Å. The reflecting system 200 further comprises a second current spreading layer 130 between the conductive reflector 120 and the second contact layer 110 for spreading current laterally. The material of the second current spreading layer 130 comprises transparent conductive oxide comprising indium tin oxide (ITO), aluminum zinc oxide (AZO), SnCdO, antimony tin oxide (ATO), ZnO, Zn$_2$SnO$_4$ (ZTO) or indium zinc oxide (IZO). In the present embodiment, the second current spreading layer 130 comprises IZO and is preferred formed by sputtering. The reflecting system 200 further comprises an insulation layer 150 between the second current spreading layer 130 and the second contact layer 110. The pattern of the insulation layer 150 is complementary to the pattern of the transparent conductive layer 140. The insulation layer 150 has a refractive index less than 1.5, and preferably between 1.3 and 1.45. The difference of the refractive index between the second contact layer 110 and the refractive index of the insulation layer 150 is larger than 1.5. The reflecting system 200 forms an omnidirectional reflector (ODR) for reflecting the light emitted from the active layer 23. The reflectivity of the reflecting system 200 is larger than 95%, and preferably is larger than 97% for the light emitted from the active layer. The insulation layer 150 comprises MgF$_x$ or porous SiO$_x$. The reflecting system 200 further comprises a transparent conductive layer 140 between the second current spreading layer 130 and the second contact layer 110, and preferably, the transparent conductive layer 140 directly contacts the second contact layer 110 for reducing the series resistance between the second electrode 50 and the light-emitting stack 20. The transparent conductive layer 140 is preferred formed by e-beam evaporation and comprises transparent conductive oxide comprising indium tin oxide (ITO), aluminum zinc oxide (AZO), SnCdO, antimony tin oxide (ATO), ZnO, Zn$_2$SnO$_4$ (ZTO) or indium zinc oxide (IZO).

The light-emitting device further comprises a passivation layer 160 covering the exposed surface of the third semiconductor layer 30, specifically, covering the roughened surface 32 of the second portion 36, a periphery wall of the light-emitting stack 20, and an exposed upper surface of the first current spreading layer 100. The passivation layer 160 serves as a protection layer to protect the third semiconductor layer 30, the light-emitting stack 20 and the first current spreading layer 100 from environment damage, such as moisture, or mechanical damage.

In one embodiment, the structure of the active layer can be single heterostructure (SH), double heterostructure (DH), double-side double heterostructure (DDH) or multi-quantum well (MQW). In the present embodiment, the structure of the active layer 23 comprises Multi-Quantum Well (MQW). Specifically, the active layer 23 comprises alternate well layers and barrier layers. The band gaps of the barrier layers are higher than the band gaps of the well layers. The band gaps of the barrier layers are lower than the band gap of the first semiconductor layer 21 and the band gap of the second semiconductor layer 23. The dominant wavelength of the light emitted from the active layer 23 can be changed by adjusting the thicknesses and the material of the well layers. Preferably, the material of the well layers comprises a Group III-V semiconductor material, such as InGaAs or AGIP. The material of the barrier layers comprises a Group III-V semiconductor material, such as AlGaAs, AGIP or GaAsP.

In accordance with a further embodiment of the present disclosure, the structures in the embodiments of the present disclosure can be combined or changed. For example, the light-emitting device as shown in FIG. 2 comprises the passivation layer. For another example, the first electrode 40 as shown in FIG. 1 can be replace with the first electrode 40 as shown in FIG. 7 or vice versa.

The foregoing description of preferred and other embodiments in the present disclosure is not intended to limit or restrict the scope or applicability of the inventive concepts conceived by the Applicant. In exchange for disclosing the inventive concepts contained herein, the Applicant desires all patent rights afforded by the appended claims. Therefore, it is intended that the appended claims include all modifications and alterations to the full extent that they come within the scope of the following claims or the equivalents thereof.

What is claimed is:

1. A light-emitting device, comprising:
   a light-emitting stack;
   an electrode on the light-emitting stack and comprising a main part and multiple extensions extended from the main part;
   a semiconductor structure on the light-emitting stack; and
   a contact layer between the light-emitting stack and the multiple extensions, and being devoid of locating between the light-emitting stack and the main part of the electrode.

2. The light-emitting device according to claim 1, wherein the semiconductor structure comprises Al.

3. The light-emitting device according to claim 1, wherein the semiconductor structure directly contacts the main part of the electrode.

4. The light-emitting device according to claim 1, wherein the contact layer has an impurity concentration greater than $10^{18}/cm^3$.

5. The light-emitting device according to claim 1, wherein the contact layer comprises GaAs, AlGaAs, InGaP, GaP or AlGaInP.

6. The light-emitting device according to claim 1, further comprising a substrate and a bonding layer between the substrate and the light-emitting stack.

7. The light-emitting device according to claim 6, further comprising a conductive reflector between the bonding layer and the light-emitting stack.

8. The light-emitting device according to claim 6, wherein from a cross section view of the light-emitting device, the bonding layer has a first width and the light-emitting stack has a second width less than the first width.

9. A light-emitting device, comprising:
   a substrate;
   a light-emitting stack on the substrate;
   an electrode on the light-emitting stack;
   a semiconductor layer on the light-emitting stack and comprising a roughened surface and an upper surface, wherein the roughened surface is exposed from the electrode and the upper surface is covered by the electrode;
   a bonding layer between the substrate and the light-emitting stack; and
   a conductive oxide layer located between the bonding layer and the light-emitting stack,
   wherein the upper surface is farther from the light-emitting stack than the roughened surface.

10. The light-emitting device according to claim 9, wherein the upper surface has a roughness smaller than that of the roughened surface.

11. The light-emitting device according to claim 9, wherein the semiconductor layer is a n-type semiconductor layer.

12. The light-emitting device according to claim 9, wherein from a cross section view of the light-emitting device, the bonding layer has a first width and the light-emitting stack has a second width less than the first width.

13. The light-emitting device according to claim 9, wherein the bonding layer has a thickness between 400 nm and 5000 nm.

14. The light-emitting device according to claim 9, wherein from a cross section view of the light-emitting device, the conductive oxide layer has a third width and the light-emitting stack has a second width less than the third width.

15. A light-emitting device, comprising:
   a light-emitting stack;
   an electrode on the light-emitting stack; and
   a semiconductor structure on the light-emitting stack and comprising:
   a first portion having an unroughened surface; and
   a second portion having a roughed surface and comprising a Group III element with a first atomic percentage decreasing along a direction from the electrode to the light-emitting stack.

16. The light-emitting device according to claim 15, wherein the fir portion comprises the Group III element with a second atomic percentage decreasing along a direction from the electrode to the light-emitting stack.

17. The light-emitting device according to claim 15, wherein the electrode merely covers the first portion.

18. The light-emitting device according to claim 15, wherein the Group III element comprise Al.

19. The light-emitting device according to claim 15, wherein each of the first portion and the second portion comprises a first sub-layer and a second sub-layer, the second sub-layer of the first portion has a first thickness and the second sub-layer of the second portion has a second thickness less than the first thickness.

20. The light-emitting device according to claim 19, wherein the first sub-layer of the second portion comprises the Group III element with a first content and the second sub-layer of the second portion comprises the Group III element with a second content greater than the first content.

* * * * *